United States Patent [19]
Lambert

[11] Patent Number: 4,713,158
[45] Date of Patent: Dec. 15, 1987

[54] SYSTEM FOR APPLIED CURRENT CATHODIC PROTECTION OF A STRUCTURE

[75] Inventor: Maurice Lambert, Lardy, France

[73] Assignee: Service National: Gaz de France, Paris, France

[21] Appl. No.: 887,214

[22] Filed: Jul. 21, 1986

[30] Foreign Application Priority Data

Jul. 23, 1985 [FR] France .................. 85 11259

[51] Int. Cl.[4] .................................. C23F 13/00
[52] U.S. Cl. ................................ 204/196; 204/147
[58] Field of Search ............... 204/147, 148, 196, 197

[56] References Cited

U.S. PATENT DOCUMENTS

| | | | |
|---|---|---|---|
| 2,985,512 | 5/1961 | Sabins | 204/196 |
| 2,987,461 | 6/1961 | Sabins | 204/196 |
| 3,425,921 | 2/1969 | Sudrabin | 204/196 |
| 3,634,222 | 1/1972 | Stephens | 204/196 |
| 3,676,319 | 7/1972 | Kirsten | 204/435 |
| 3,714,004 | 1/1973 | Riggs et al. | 204/196 |
| 4,147,608 | 4/1979 | Stevens | 204/196 |

Primary Examiner—T. Tung
Attorney, Agent, or Firm—Staas & Halsey

[57] ABSTRACT

The system includes means for cyclically putting into operation a circuit for controlling and regulating a DC generator connected between the structure to be protected which constitutes a cathode and the anodes of a group of anodes which are insulated from the structure and are in contact with the electrolyte in which said structure is placed. The circuit includes means for reading the potential provided by a reference electrode, for calculating the potential difference between the structure and the electrode potential as read, and for comparing the calculated potential difference with upper and lower thresholds. The value of the voltage output from the generator may be adjusted by means in steps of predetermined value as a function of the comparison signals delivered by the comparator. The system is particularly applicable to protecting underground or underwater metal structures from corrosion.

8 Claims, 4 Drawing Figures

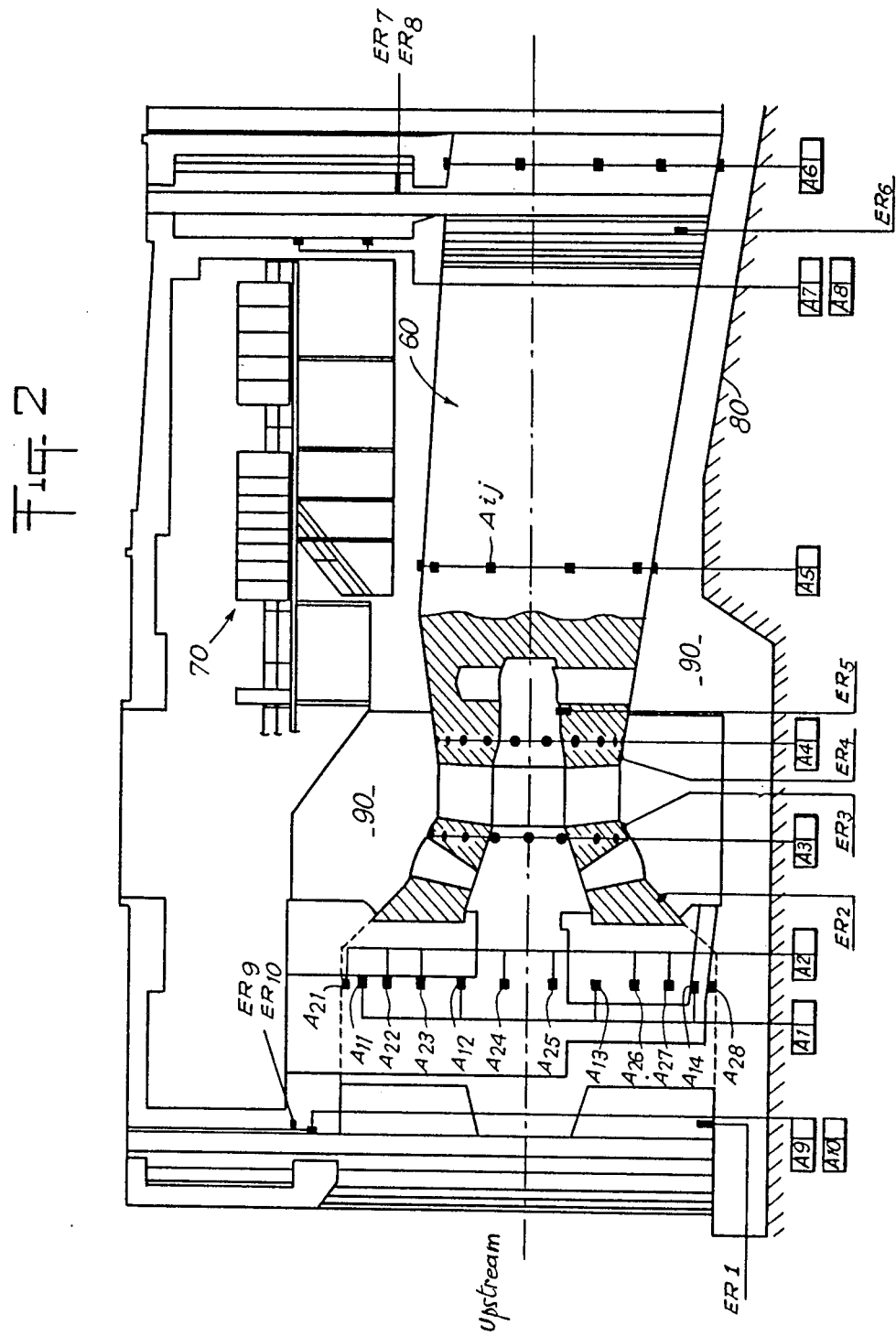

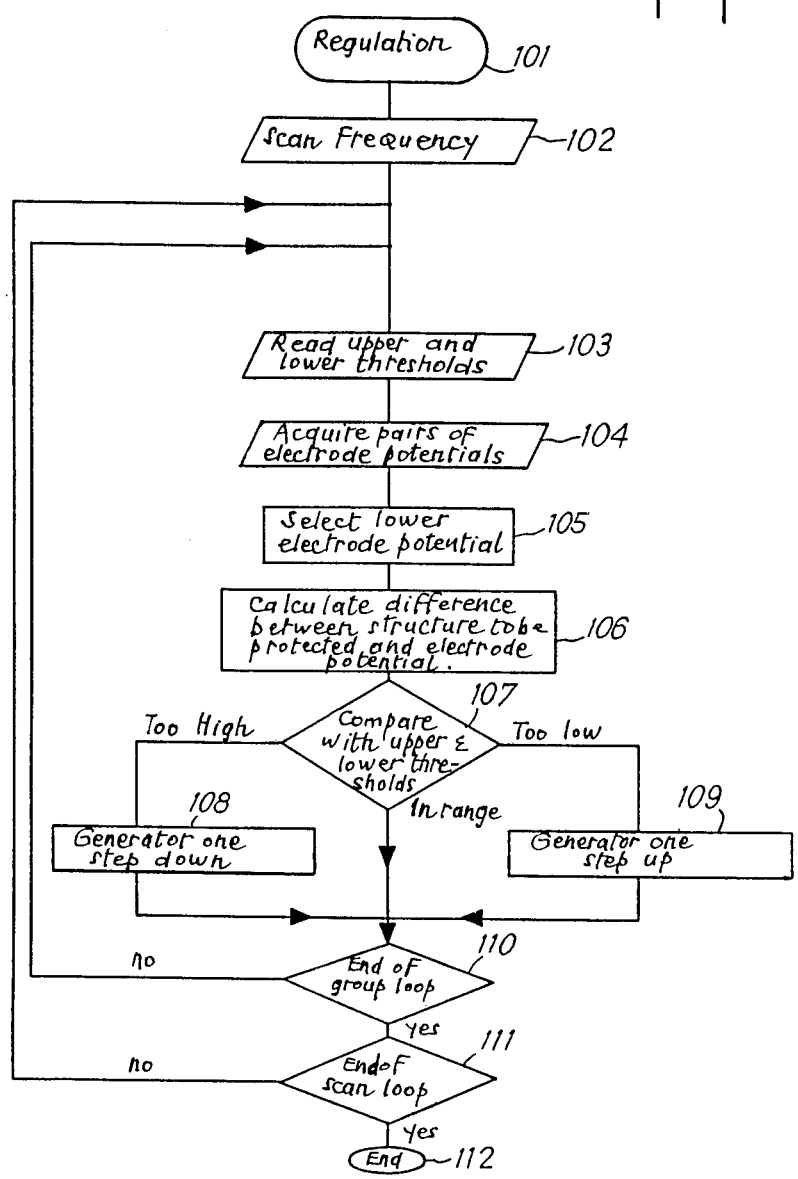

SYSTEM FOR APPLIED CURRENT CATHODIC PROTECTION OF A STRUCTURE

The present invention relates to an applied current cathodic protection system for protecting a structure placed in an electrolyte, the system comprising at least one cathode constituted by the structure to be protected, at least one group of anodes isolated from the structure and in contact with the electrolyte in which said structure is placed, at least one DC generator connected between the cathode-forming structure and said group of anodes in contact with the electrolyte, and at least one reference electrode connected to a control and regulation circuit for adjusting the potential delivered by said generator, and consequently for adjusting the current applied to said anodes.

BACKGROUND OF THE INVENTION

Cathodic protection is a method of protecting underground and underwater metal structures against corrosion. Protection is obtained by causing a DC generator to pass current between anodes placed in the electrolyte (water or ground) and isolated from the structure, and a cathode constituted by the structure to be protected.

The polarization conditions of metals that need protecting vary depending on a large number of factors: variations in the insulating resistance of a protective covering, if any; variations in the resistivity of the electrolyte; the influence of the speed of electrolyte flow; the formation of deposits on the parts to be protected; etc.

The characteristics of the DC generator thus need to be adapted so that the polarization is maintained at a suitable value.

In prior cathodic protection systems, the power level of the generator is often manually adjusted. For example, the voltage at the output from the generator may be varied by means of a variable annular auto-transformer, a magnetically saturateable transformer, a multiply-tapped transformer, or by means of circuits using thyristors or triacs.

The generator power level may also be regulated automatically by servocontrol means. In this case, the servocontrol means compare a reference potential to be obtained with the potential of the structure to be protected as measured by means of a reference electrode permanently placed on said structure, and said means deliver a control signal as a function of the comparison. Said signal is then amplified and transformed into a current which is caused to flow between said anodes and the structure to be protected in such a direction as to ensure that the current tends to return the potential of the structure to the reference value.

Such a system may be referred to as a "potentiostat".

However, two factors limit industrial application of this type of regulation:
firstly the variations in polarization conditions may be very large, in particular when protection is being applied to pumps, turbines, filter grids, and other apparatuses and structures in which the speed or composition (inter alia) of the electrolyte are subject to large variations; this requires the potentiostat to be overdimensioned if it is to work properly; and
secondly, in some structures such as those mentioned above, the shapes of the parts to be protected and the configuration of the electric field due to the protection current require several series of anodes to be used with a single structure, with each series of anodes being fed from a different generator, even though all of the anodes co-operate in an electrolytic circuit which is common to the entire system of anodes and the cathode.

As mentioned above, in the first place the potentiostat needs to be overdimensioned in order to be sure that it operates properly in all polarization conditions.

In the second place, it is necessary to have as many potentiostats as there are series of anodes corresponding to different portions of the machine to be protected. Interactions occur between the various potentiostats due both to the electrical continuity between the various metal parts of the structure to be protected and also to the common electrolytic medium constituted by the moving liquid, which interactions give rise to instabilities in potential and to phenomena of current oscillation at the outputs from the potentiostats.

Preferred embodiments of the present invention remedy the above drawbacks and allow a current generator for providing cathodic protection to adapt automatically to variations in polarization conditions without it being necessary to overdimension the system, and while simultaneously reducing the influence of interference on the potential of the structure to be protected, which interference is due to the presence of an electrolyte which is common to the various anode-to-cathode circuits.

Preferred embodiments of the invention also provide a system which is also applicable to at least two distinct cathodes which are polarized by respective generators and anodes in a configuration such that the electric fields of the anode-rectifier-cathode assemblies interfere.

SUMMARY OF THE INVENTION

The present invention provides an applied current cathodic protection system for a structure of the type defined above, which system, in accordance with the invention, includes means for bringing into service the circuit for controlling and regulating a generator in a cyclic manner, means for reading the potential provided by the reference electrode and for calculating the potential difference between the protected structure and the electrode potential as read, comparator means for comparing the calculated potential difference with a first reference potential constituting an upper threshold and with a second reference potential constituting a lower threshold, and means for adjusting the absolute value of output voltage delivered by the generator in steps of predetermined value, said means increasing said absolute value if the calculated potential difference is less negative than the upper threshold, and decreasing said absolute value if the calculated potential difference is more negative than the lower threshold.

In accordance with a special feature, the means for cyclically putting the control and regulation circuit of a generator into service comprise a clock whose cycle frequency is adapted to the duration of the electrochemical polarization.

According to another special feature, the means for cyclically putting the control and regulation circuit of a generator into service comprise a slow-release contact whose closure is functionally related to the structure to be protected.

A control and regulation circuit for a generator may thus be cyclically controlled by means of a relay which is servocontrolled to the state of the machine including the structure to be protected.

This makes it possible, in particular, to re-adjust the current applied to the anodes each time similar conditions occur, for example whenever the machine is switched on, or is in operation, for a given operating state corresponding to a given state of the polarization conditions.

Advantageously, the system includes at least two reference electrodes connected to the control and regulation circuit associated with the same generator and the same group of anodes, and the means for reading the reference potential include a comparator circuit for determining which reference electrode is the most electronegative during each cycle and for selecting the most negative potential for calculating the calculated potential difference.

In this case, the system also includes means for indicating when the difference between the two potentials of the reference electrodes exceeds a predetermined value.

In a particular application of the invention, the system comprises a plurality p of groups of anodes distributed over various zones of the structure to be protected, said anodes being insulated from said structure and being in contact with the electrolyte; the same plurality p of DC generators each being connected to a corresponding group of anodes; groups of reference electrodes disposed in the vicinity of the various groups of anodes and connected to different ones of the control and regulation circuits for adjusting the voltages delivered by the generators associated with the various groups of anodes; means for cyclically putting into service the various control and regulation circuits, and means for attributing first and second reference potentials to each control and regulation circuit, said first and second reference potentials constituting upper and lower thresholds, and for adjusting the value of the output voltage delivered by each generator associated with a group of anodes in steps of predetermined size as a function of the value of the calculated potential difference relative to said upper and lower thresholds.

Advantageously, the reference electrodes are constituted by electrodes including a supply of electrolyte which is saturated in such a manner as to have properties which remain constant over time regardless of variations in the composition of the electrolyte in which the structure to be protected is placed.

BRIEF DESCRIPTION OF THE DRAWINGS

An embodiment of the invention is described by way of example with reference to the accompanying drawings, in which:

FIG. 2 is a diagrammatic view of an example of a structure to which the invention may be applied;

FIG. 3 is a flowchart showing the sequential operation of a control and regulation circuit in accordance with the invention.

MORE DETAILED DESCRIPTION

Figure 1:
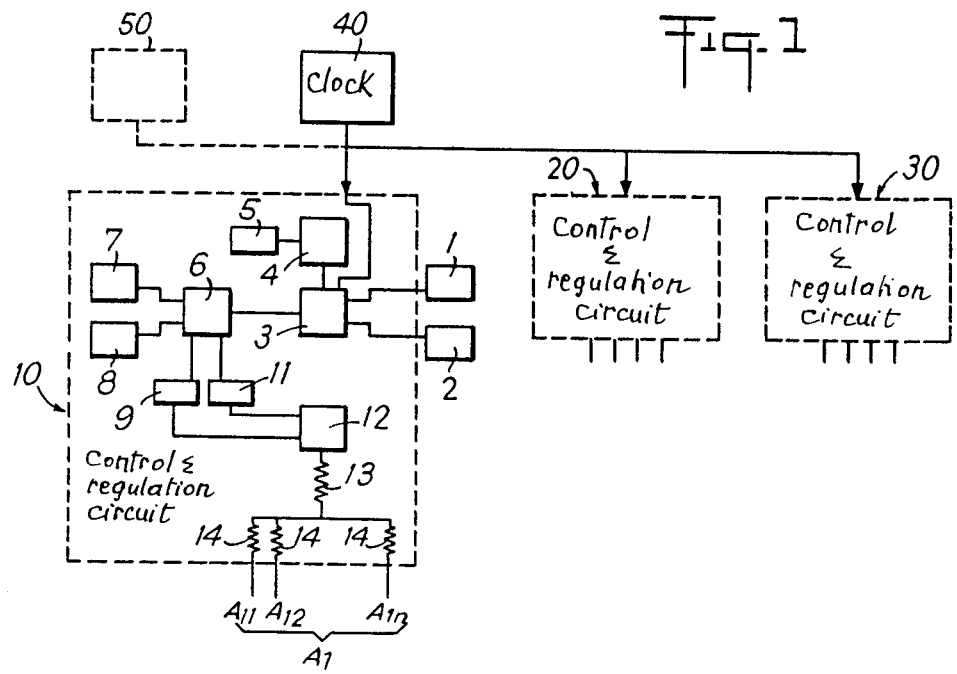
FIG. 1 is a block diagram of a control and regulation circuit included in a system in accordance with the invention.

FIG. 2 shows a metal structure capable of acting as a cathode and thus capable of being provided with cathodic protection. By way of example, the structure is constituted by an axial flow water turbine 60 placed in an aqueous medium 90 which may be constituted by seawater, and surrounded by an infrastructure 80. The invention is nevertheless applicable to numerous other types of metal structures which may be located in water or in the ground, for example alternators, metal ducts, valves, and the hulls of ships.

A plurality of groups of anodes $A_1$ to $A_{10}$ are disposed over various zones of the structure to be protected 60. Each group of anodes $A_i$ (where i is an integer lying in the range 1 to 10 in the present example) comprises a plurality of anodes $A_{ij}$ (where j lies in the range 1 to 12, for example) all fed from a common current generator. FIG. 2 shows the power supply blocks for the various groups of anodes only in overall form as a bank 70. FIG. 2 shows anodes $A_{11}$, $A_{12}$, $A_{13}$, $A_{14}$ of group $A_1$, and anodes $A_{21}$, $A_{22}$, $A_{23}$, $A_{24}$, $A_{25}$, $A_{26}$, $A_{27}$, and $A_{28}$ of group $A_2$.

Each of the anodes $A_{ij}$ is isolated from the metal structure 60 which acts as the cathode and which is in contact with the electrolyte 90. The anodes $A_{ij}$ may project from the metal structure 60 with an insulating member being disposed between the structure 60 and each anode $A_{ij}$. The anodes $A_{ij}$ may alternatively be embedded, and they may be embedded in the concrete civil engineering structure surrounding the metal structure 60 rather than being directly on the metal structure 60. Such anodes are then constituted by respective metal parts which are embedded in a plastic strap having a sealed connection, and with the entire assembly being received in a recess provided for the purpose.

The anodes $A_{ij}$ of any one group $A_i$ are placed in such a manner as to provide a good distribution of the electric field within the electrolyte 90. The various groups of anodes $A_1$ to $A_{10}$ correspond to different portions of the machine to be protected, for example different subassemblies of the metal structure of a turboalternator set as shown in FIG. 2.

A group of at least two reference electrodes is disposed in the vicinity of each group of anodes. In FIG. 2, references $ER_1$ to $ER_{10}$ designate the pairs of reference electrodes associated with respective anode groups $A_1$ to $A_{10}$.

It is known that in a medium whose position varies significantly over time, the potential of the reference electrodes is not stable since it depends on the ion concentration reacting in the electrode potential-forming process (for example chlorine ions for mercury/calomel electrodes or for silver/silver-chloride electrodes).

That is why standard reference electrodes may be replaced by reference electrodes fitted with a supply full of crystals of the reacting salt which saturates the solution in which the electrode is immersed. The saturated solution and the external medium are put into communication via a porous filter, and the period for which the electrode gives a stable indication depends on the rate at which diffusion takes place through the porous filter and on the capacity of the original supply of salt in the electrode. This method can be used to make electrodes which operate stably for at least one year.

Reference is now made to FIG. 1 which is a block diagram of a set of control and regulation circuits 10, 20, 30, . . . suitable for use in combination with corresponding groups of anodes $A_1$, $A_2$, $A_3$, . . . and with corresponding sets of reference electrodes $ER_1$, $ER_2$, $ER_3$, . . . as shown in FIG. 2.

It is recalled that in an applied current cathodic type of protection system, direct current is caused to flow between anodes immersed in the ground or the liquid surrounding the metal structure to be protected and said structure itself which constitutes a cathode. It is important to maintain the value of the current used within a range of given values. If the current is too small then some corrosion still takes place, and if the current is too large then electrical energy is wasted. The reference electrodes serve, in particular, to measure the potential difference which exists between the reference electrodes (which potential is assumed to be stable) and the structure to be protected whose potential is variable, thereby making it possible to verify whether the applied current is correct, too high, or too low.

In known automatic servocontrol systems, the signals from the reference electrodes are amplified and actuate devices which modify the direct current as applied by a generator in order to permanently maintain the applied current within a predetermined range of values.

As mentioned above, the use of a servosystem with a short time constant to ensure that the potential of the structure to be protected remains constantly equal to or less than a maximum cathodic protection potential leads to an overdimensioned current generator being installed in order to satisfy maximum current demands due to current demands varying considerably with the flow speed of the electrolyte in contact with the metal to be protected. This speed is non-negligible when the structure, for example, is in contact with agitated seawater, and it is difficult to monitor because of the formation of calcium/magnesium deposits on the structure to be protected.

When a plurality of anode-to-cathode circuits are disposed on a single structure, continuous servocontrol additionally gives rise to oscillations in the current delivered by the generators.

That is why each control and regulation circuit 10, 20, 30, in accordance with the invention is controlled cyclically in order to adapt the current stepwise during use, thereby bringing the potential of the structure to be protected into a range of predetermined values by stages.

The following description relates to the control and regulation circuit 10 which is associated with the first group of anodes $A_1$ and with the set $ER_1$ of reference electrodes 1 and 2 placed on the portion of the machine to be protected which is concerned with the generator 12 which delivers current to the anodes $A_{11}$ to $A_{1n}$ of the group $A_1$.

The reference electrodes 1 and 2 are connected to the comparator 3 which measures the potential difference between the electrodes 1 and 2 and selects the most electronegative of the electrodes 1 and 2 for controlling regulation. Only one of the electrodes 1 and 2 is actually used for controlling regulation, but the other reference electrode is used in conjunction with the comparator 3 to perform checks between the reference electrodes 1 and 2 each time either of them is used. When the potential difference measured by the comparator 3 exceeds a predetermined threshold fixed by a threshold circuit 4 connected to the comparator 3, an alarm 5 is set off to indicate that at least one of the reference electrodes 1 and 2 is defective.

The potential of the reference electrode 1 or 2 as selected by the comparator 3 is applied to a second comparator 6 which performs two comparisons: it compares the potential provided by the comparator 3 firstly with an upper threshold potential $E_H$ and secondly with a lower threshold potential $E_B$ as generated by circuits 7 and 8 connected to the comparator 6. The upper and lower threshold potentials $E_H$ and $E_B$ are generated by means of reference voltages if the comparator 6 is an analog comparator, or else they are numbers recorded in a memory if the comparator 6 is digital type comparator.

If the potential provided by the comparator 3 lies between the upper and lower threshold values $E_H$ and $E_B$, the comparator 6 does not deliver any signal to either of the relays 9 and 11 which it uses for controlling changes in the output voltage from the generator 12. However, if the value supplied by the comparator 3 is more negative than the lower threshold $E_B$, too much polarization is taking place and a signal of fixed duration is applied to relay 11, thereby reducing the voltage delivered by the generator 12 by a previously determined fixed amount (for example by 0.2 V).

If the potential delivered by the comparator 3 is less negative than the upper threshold $E_H$, then the polarization is too little and the relay 9 is used to control an increase in the voltage delivered by the generator 12 by a predetermined fixed amount (for example also by 0.2 V).

Each cycle of the type described above is initiated, either by a clock 40 whose cycle frequency is matched to the duration of electrochemical polarization (which frequency may be two cycles per day, for example), or else by a slow-release contact 50 related to the operation of the structure 60 to be protected. For example, the contact 50 may be triggered each time the machine is switched on.

Figure 4:
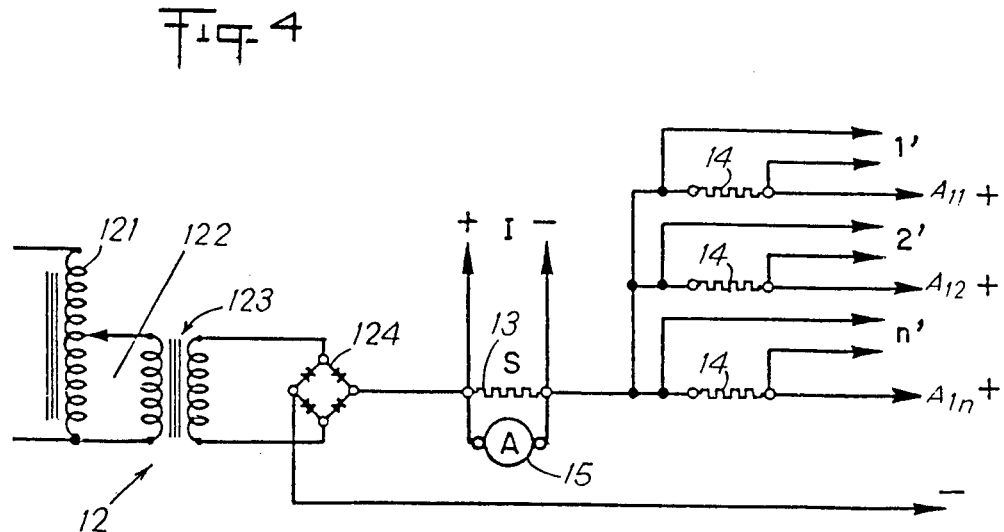
FIG. 4 is a circuit diagram of a DC generator capable of being used in the invention.

As shown in FIG. 4, a DC generator 12 may comprise, for example, a variable autotransformer 121 feeding a rectifier circuit 124 via a transformer 123, with the rectifier circuit 124 being connected to a group of anodes, e.g. the group $A_1$. The current I delivered by the rectifier circuit 124 is measured by means of a shunt 13 having an ammeter 15 connected across its terminals.

The transformation ratio of the autotransformer 121 may be controlled by an electromechanical system including a motor 122 or by an electronic system controlled by a microprocessor which runs the control circuit 10 and which is capable of ensuring that a current set by the microprocessor on the basis of data provided at comparison steps 3 and 6 is, in fact, applied to the set of anodes.

Resistances 14 connected in series between the generator 12 and respective ones of the anodes $A_{11}$ to $A_{1n}$ serve to provide signals representative of the current applied to each anode $A_{11}$ to $A_{1n}$ of a given group $A_1$ by the generator 12.

A current limiter device may be associated with the control circuit 10. The value of the maximum current to be supplied by the rectifier 124 is memorized and the memorized maximum current value is compared with the value supplied by the ammeter 15 or by the equipment connected to the resistances 14, and this operation is performed during each current readjustment cycle while the variable autotransformer 121 is being controlled to change its transformation ratio.

This comparison can give rise to an instruction to stop movement of the autotransformer cursor or to cause its movement to be reversed so as to limit or reduce the voltage applied to the rectifier 124 to a value such that the current delivered by the generator 12 does not exceed a predetermined maximum current threshold when the generator is being modified stepwise.

The essential advantage of a control system in accordance with the invention lies in the characteristics of the rectifiers being adjusted to match variations in the cathodic polarization conditions stepwise and over a period of time, and system safety is ensured by selecting one reference electrode from a plurality of reference electrodes situated close to one another.

This automatic stepwise adjustment avoids the need for manual monitoring and adjustment. In addition, the cyclic action makes it possible to intervene on a plurality of cathodic protection generators controlling groups of anodes $A_1$ to $A_{10}$ which may influence one another mutually.

By proceeding through successive order for stepwise control of selecting a suitable sequential order for stepwise control of the control circuits 10, 20, 30, . . . associated with the various groups of anodes $A_1$, $A_2$, $A_3$, . . . it is possible to reduce interference between the various circuits on the potential of the structure to be protected.

FIG. 3 is a simplified flowchart showing how a cathodic protection system in accordance with the invention and including a plurality of groups $A_i$ of anodes $A_{ij}$ is regulated.

Stage 101 corresponds to the regulation system being initialized. Stage 102 defines a scanning frequency which determines the cyclic behavior of the system and which must be matched to operating conditions. This scanning frequency corresponds to the frequency of the clock 40 shown in FIG. 1 and may be about one or two cycles a day. Regulation may also be initialized by the slow-release relay 50 which is activated, for example, by the machine being switched on, or by a particular operation being performed, for example by a pumping operation being performed, thereby ensuring that the current adjustment sequence is always performed under similar polarization conditions.

The regulation scheme includes a series of scanning loops, and the number of loops is a function of the scanning frequency, with a test 111 at the end of the scanning loop determining the end 112 of a regulation cycle.

For each scanning loop, one or more group loops are performed depending on the number of groups of anodes included in the cathodic protection system.

For each group loop corresponding to an anode group $A_i$, stage 103 corresponds to the upper and lower thresholds $EH_i$ and $EB_i$ being red to define a potential range which matches the particular depolarization conditions in the vicinity of the group of electrodes under consideration. Stage 104 corresponds to the acquisition of pairs of electrode potentials $ELi1$ and $ELi2$ corresponding to the two reference electrodes 1 and 2 associated with the control circuit for the group $A_i$ under consideration.

Stage 105 in a group loop corresponds to selecting the lower potential electrode 1 or 2 by comparison between the values of the potentials of the reference electrodes $ELi1$ and $ELi2$. The flowchart does not show an optional stage which consists in comparing the absolute value of the difference $ELi1-ELi2$ with a given threshold for triggering an alarm if the threshold is exceeded (circuits 4 and 5 of FIG. 1).

Stage 106 of a group loop responds to calculating the potential difference between the structure to be protected 60 and the potential of the reference electrode selected at stage 105.

Stage 107 consists in performing two tests between the value calculated at stage 106 and firstly the upper threshold $EH_i$ and secondly the lower threshold $EB_i$ as read during stage 103. If the value of the calculated potential difference is greater than the upper threshold $EH_i$, the following stage is stage 108 which consists in reducing the value of the current delivered by the current generator in the loop under consideration by one step.

If the value of the calculated potential difference is less than the lower threshold $EB_i$, the next stage is stage 109 which consists in increasing the value of the current delivered by the current generator 12 of the loop under consideration by one step. After stage 108 or stage 109, or if the calculated potential difference lies between the upper and lower thresholds $EH_i$ and $EB_i$, the end of group loop test 110 is performed.

I claim:

1. An applied current cathodic protection system for a structure placed in an electrolyte, the system comprising:

a cathode constituted by the structure to be protected;

a group of anodes isolated from the structure and in contact with the electrolyte in which said structure is placed;

a DC generator connected between the cathode-forming structure and said group of anodes in contact with the electrolyte;

a reference electrode a control and regulation circuit, connected to said reference electrode and said generator, for adjusting the potential delivered by said generator and consequently for adjusting the current applied to said anodes;

means for bringing into service in a cyclic manner the circuit for controlling and regulating said generator;

means for reading the potential provided by the reference electrode and for calculating the potential difference between the protected structure and the electrode potential as read;

comparator means for comparing the calculated potential difference with a first reference potential constituting an upper threshold and with a second reference potential constituting a lower threshold; and means for adjusting the absolute value of output voltage delivered by the generator in a single step during each cycle of the cyclic operation of said circuit for controlling and regulating the generator, said means increasing said absolute value by a fixed predetermined value different from zero if the calculated potential difference is less negative than the upper threshold, decreasing said absolute value by a fixed predetermined value different from zero if the calculated potential difference is more negative than the lower threshold and adding to said absolute value a predetermined value equal to zero if the calculated potential difference is between the lower and upper thresholds.

2. A system as claimed in claim 1, wherein the system includes at least two reference electrodes connected to the control and regulation circuit associated with the generator and the group of anodes, and wherein the means for reading the reference potential includes a comparator circuit for determining which reference electrode is the most electro-negative during each cycle and for selecting the most negative potential for calculating the calculated potential difference.

3. A system as claimed in claim 2, further including means for indicating when the difference between the potentials of the reference electrodes exceeds a predetermined value.

4. A system as claimed in claim 1, wherein the means for putting the control and regulation circuit of a generator into service cyclically comprise a slow-release contact whose closure is functionally related to the structure to be protected.

5. A system as claimed in claim 1, wherein the means for putting the control and regulation circuit of a generator into service cyclically comprise a clock whose cycle frequency is adapted to the duration of the electrochemical polarization.

6. An applied current cathodic protection system for a structure placed in an electrolyte, said system comprising:
- a cathode constituted by the structure to be protected;
- a plurality of groups of anodes distributed over various zones of the structure to be protected, said anodes being insulated from said structure and being in contat with the electrolyte;
- a plurality of DC generators connected between the cathode forming structure and the respective group of anodes;
- a plurality of control and regulation circuits for adjusting the potentials delivered by the connected respective generators associated with respective groups of electrodes;
- a plurality of reference electrodes which are located in the vicinity of the respective groups of anodes and connected to the respective control and regulation circuits
- means for cyclically putting into service the respective control and regulation circuits; and
- means for attributing a plurality of first and second reference potentials to the respective control and regulation circuit, said first and second reference potentials constituting upper and lower thresholds for the respective control and regulation circuits;

each control and regulation circuit comprising:
- means for reading the potential provided by the associated reference electrode and for calculating the potential difference between the protected structure and the reference electrode potential as read;
- comparator means for comparing the calculated potential difference with the upper and lower threshold attributed to the control and regulation circuit; and
- means for adjusting the absolute value of output voltage delivered by the associated generator in a single step during each cycle of the cyclic operation of the control and regulation circuit, said means for adjusting increasing said absolute value by a fixed predetermined value different from zero if the calculated potential difference is less negative than the upper threshold, decreasing said absolute value by a fixed predetermined value different from zero if the calculated potential difference is more negative that the lower threshold, and adding to said absolute value a predetermined value equal to zero if the calculated potential difference is between the lower and upper threhold.

7. A system as claimed in claim 1, wherein at least one reference electrode includes a supply of electrolyte which is saturated in such a manner as to have properties which remain constant over time regardless of variations in the composition of the electrolyte in which the structure to be protected is placed.

8. A system as claimed in claim 7, wherein the supply of electrolyte in the at least one reference electrode comprises crystals of a reactive salt which saturate the solution in which the electrode is immersed, and wherein the saturated solution is put into communication with the external electrolyte medium via a porous filter.

* * * * *